United States Patent [19]

Tiemann

[11] Patent Number: 4,780,605

[45] Date of Patent: Oct. 25, 1988

[54] COHERENT LIGHT PHASE DETECTING FOCAL PLANE CHARGE-TRANSFER-DEVICE

[75] Inventor: Jerome J. Tiemann, Schenectady, N.Y.

[73] Assignee: General Electric Company, Schenectady, N.Y.

[21] Appl. No.: 121,966

[22] Filed: Nov. 16, 1987

[51] Int. Cl.⁴ .......................... G01J 1/20; G06F 7/38
[52] U.S. Cl. .................. 250/201; 364/724.01
[58] Field of Search .......... 250/201 R, 578; 324/77 K; 364/514, 518, 724, 728; 358/31, 36, 40

[56] References Cited

U.S. PATENT DOCUMENTS

| 4,209,843 | 6/1980 | Hyatt | 364/724 |
| 4,480,192 | 10/1984 | Albrecht et al. | 324/77 K |
| 4,491,930 | 1/1985 | Hyatt | 364/724 |
| 4,722,079 | 1/1988 | Matsumoto | 250/201 R |

Primary Examiner—David C. Nelms
Assistant Examiner—William L. Oen
Attorney, Agent, or Firm—Geoffrey H. Krauss; James C. Davis, Jr.; Marvin Snyder

[57] ABSTRACT

A coherent light phase detecting focal plane array uses a bulk substrate of a first conductivity-type semiconductor, with a layer of the opposite conductivity-type of that semiconductor formed into an array of CTD cells each storing charge converted from optical photons impingent upon the layer, when positioned in the focal plane of apparatus in which the array is used. Surrounding each cell are four FET structures which separately and individually collect the charge samples during an associated different one of four sampling periods, corresponding to the four quadrants of a two-dimension phase space (+I, +Q, −I and −Q samples). Each FET has five gate electrodes, so as to provide five individual regions for storage and manipulation of the photo-induced change during acquisition, readout and disposal. A correlated-double-sampling form of readout provides separate in-phase I axis video information and quadrature-phase Q axis video information, from which a determination of the amplitude and phase of the light impingent upon each pixel can be made.

17 Claims, 5 Drawing Sheets

COHERENT LIGHT PHASE DETECTING FOCAL PLANE CHARGE-TRANSFER-DEVICE

BACKGROUND OF THE INVENTION

The present invention relates to a charge transfer device (CTD) imaging array and, more particularly, to a novel focal point CTD array for providing a video output responsive to the amplitude and the phase of coherent light impingent upon each cell thereof.

There are many situations in which it is advantageous to be able to measure the optical path length between a pair of points (typically, between a fixed-location point and a point having a location to be determined) with an accuracy within a small fraction of one wavelength of the light of the measuring beam being utilized. In such applications, a coherent laser beam is normally used with a beam splitter, to obtain interference patterns between the light returning from the distant object-to-be-located, and a reference beam with known, and usually constant, phase and amplitude characteristics. By well known interferometry principles, changes in path length can be determined either as a function of position in the image plane, or, in the case of a moving object, as a function of time for a single point. In certain applications, improved performance can be obtained if a large number of path length measurements can be simultaneously taken. In Doppler velocimetry usage, the object (to which the distance is to be measured) is commonly a suspension of fine particles in a fluid or gaseous environment; the suspension is usually subject to a combination of incoherent and coherent motions. In this usage, it is possible to obtain an improved estimate of the coherent motion by averaging a number of independent views of the speckle pattern generated by the suspended particles. Since the phase of two points in a speckle pattern is uncorrelated if those two points are separated by more than the resolution limit of the optical system, a phase detecting imager can be used to advantage if the imager pixel spacing slightly exceeds the optical resolution of the apparatus. Each imager pixel will provide an independent estimate of the velocity; all of the individual pixel estimates can then be averaged to obtain an improved overall velocity estimate. In other applications, such as with Fourier optics, use of a phase-detecting imager can provide phase information at each array pixel within the aperture of an optical beam, so that the distribution of objects can be obtained, by Fourier transformation, from the amplitude and phase of the Fraunhofer diffraction pattern. It is therefore highly desirable to provide a focal point array in which coherent light amplitude and phase information can be detected, while maintaining an adequate signal to noise ratio and maintaining the imager output data rate at a manageable level. It is not possible to determine both the required phase information and the required amplitude information at each pixel of the array, with only a single measurement at that pixel.

BRIEF SUMMARY OF THE INVENTION

In accordance with the invention, an optical interference pattern is generated by interaction between a probe beam, containing information as to the distribution of the object(s) to be determined, and a reference beam which has been frequency shifted, by some means (such as a Bragg cell and the like), with respect to the frequency (color) of the probe beam. The relative phase between the two beams will appear as a time-related difference function, at any one pixel. By sampling the amplitude and phase of the interference pattern at at least three, and preferably four, different times during each difference frequency cycle, the relative phase angle and amplitude of the probe beam can be independently determined. The sampling is carried out by a coherent light phase-detecting planar array located in the focal plane of the interference-pattern-producing optics. The coherent light phase detecting focal plane array comprises: a bulk substrate of a first conductivity-type semiconductor (e.g. n-type silicon) having a layer of the opposite conductivity-type of that semiconductor (e.g. p-type Si) on a surface thereof and formed into an array of cells, each for storage of charge converted from optical photons impingement upon the layer surface further from the substrate, and typically positioned in the focal plane of apparatus in which the array is used. Associated with, and surrounding, each cell (or pixel) are a plurality of field-effect-transistor (FET) structures which separately and individually collect the charge samples during an associated different one of a like plurality of sampling periods at the asociated pixel; preferably, four FETs and four cyclically consecutive sampling intervals are used, corresponding to the four quadrants of a two-dimension complex space ($+I$, $+Q$, $-I$ and $-Q$ samples). Each FET has a plurality of gate electrodes, so as to provide a like plurality (e.g. five) of regions for storage and manipulation of the photo-induced charge during acquisition, readout and disposal. A readout technique that is capable of providing both positive and negative weightings, such as correlated double sampling, and the like, provides separate in-phase I axis video information and quadrature-phase Q axis video information, from which a determination of the amplitude and phase of the light impingement upon pixel can be made.

In one presently preferred embodiment, each different one of four P-type FET structures is formed adjacent to a different corner of a rectangular anode region of each CTD array cell; the line-scanned array includes on-chip charge amplifier and sampling circuitry, to provide a total I-axis video component and a total Q-axis video component, from each pixel during each cycle of the difference frequency.

Accordingly, it is an object of the present invention to provide a novel focal plane CTD array for providing output information at least related to the phase and amplitude of coherent light impingement upon each cell of that array.

This and other objects of the present invention will become apparent upon reading of the following detailed description, when considered in conjunction with the associated drawings.

DETAILED DESCRIPTION OF THE INVENTION

Figure 1:
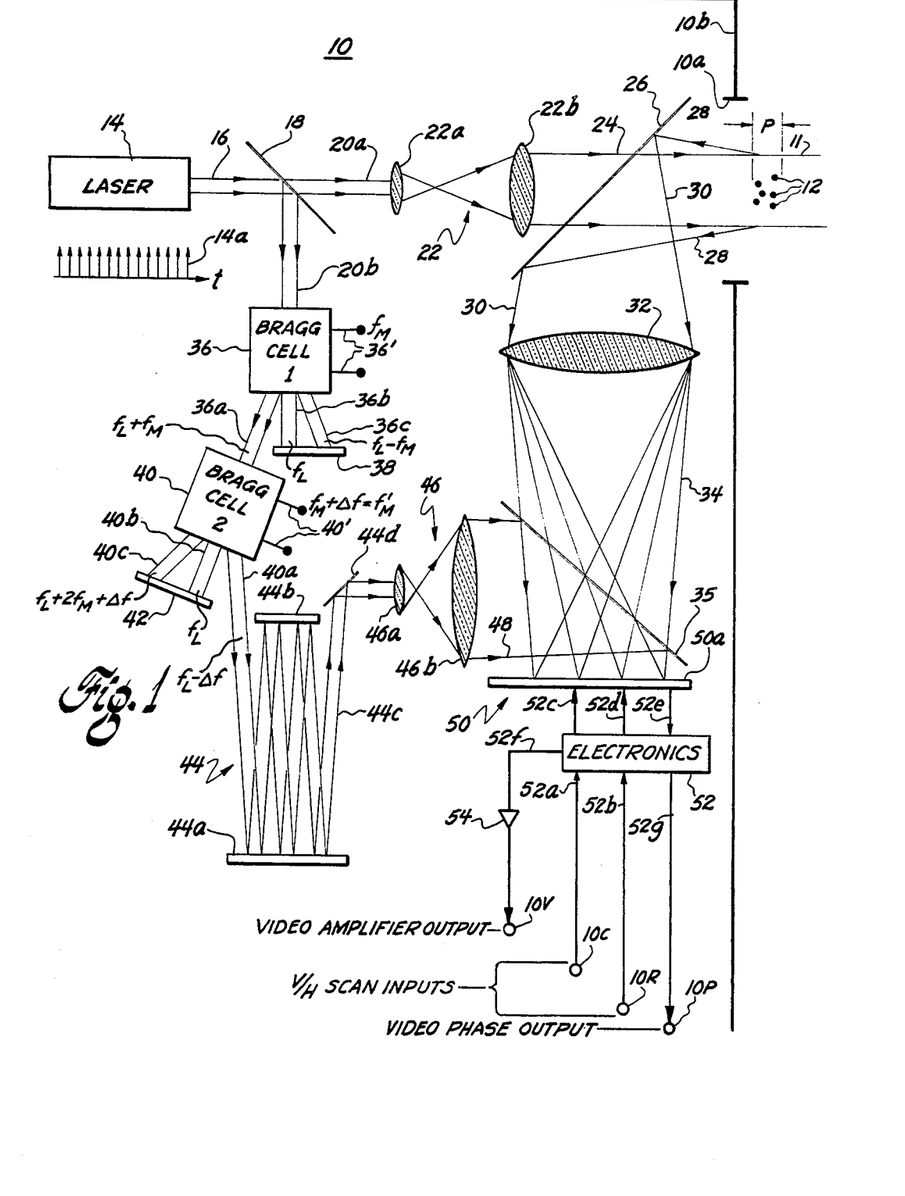
FIG. 1 is a schematic block diagram of one possible apparatus in which the novel focal plane CTD array of the present invention can be utilized.

Referring initially to FIG. 1, one possible environment of the coherent light phase detecting focal plane CTD array of the present invention is a Doppler velocimeter, in which a beam 11 of coherent light is utilized for estimating the coherent motion of a suspension of particles 12. Both a probe beam and a reference beam originate in a coherent-light-generating means, such as a laser 14 generating a quasi-CW output beam 16 formed of a succession of coherent light pulses 14a. The coherent beam 16 is split in a first beam splitting means 18, with a first, transmitted beam portion 20a entering a first beam expanding means 22, comprised of at least first and second lenses 22a and 22b. The expanded probe beam 24 passes through a second beam splitting means 26, prior to exiting (via an aperture 10a in case 10b) from apparatus 10 towards suspension 12. As the beam is comprised of a succession of individual coherent light pulses 14a, at any instant only those particles 12 within an actual pulse P receive coherent light to be reflected as reflected beam 28. The reflected beam 28 re-encounters second beam splitting means 26 and is redirected, as beam 30, to a lens means 32 for focussing the probe beam 34, after passage through a third beam splitting means 35, upon a focal plane.

First beam splitting means 18 also provides a reflected beam portion 20b to a first Bragg cell modulator 36. In accordance with the periodic modulating signal (of frequency $f_M$) at cell beam-direction control terminals 36′, the entering beam 20b (of frequency $f_L$) is deflected by the acousto-optical diffraction grating to three output positions, including an up-converted leftmost deflected position 36a at which the beam frequency is $(f_L+f_M)$, a center (substantially undeflected) position 36b at which the beam frequency is unchanged (i.e. is frequency $f_L$), and a down-converted right-most deflected position 36c at which the beam frequency is $(f_L-f_M)$. An optical stop means 38 is utilized to terminate the beam over all but the left-most beam position 36a. Thus, the first-deflected beam portion 36a is up-converted by a first frequency $f_M$ (the frequency of the drive signal at inputs 36′). The up-converted light beam 36a impinges upon a second Bragg cell modulator means 40, which is modulated by a second periodic signal provided to second modulator inputs 40′. Responsive to this second signal, which is at a second frequency $f_M'=f_M+\Delta f$, the beam is again deflected to three distinct positions, including right-most deflection position 40a with a net frequency of $(f_L-\Delta f)$, a central (substantially undeflected) position 40b, and a left-most deflected position 40c with a net frequency $(f_L+2f_M+\Delta f)$. Another optical stop means 42 is provided to prevent all but the down-converted (right-most) second-deflected beam (e.g. portion 40a) from being transmitted. Frequencies $f_M$ and $f_M'$ are chosen to be in a range that is convenient for the Bragg cells, and are typically in the range of 50 MHz to 100 MHz. The net frequency shift of the emerging beam 40a is $-\Delta f$, and this net shift is adjusted to be a predetermined offset from the expected Doppler shift of the reflected probe beam 28. In this manner, the actual difference frequency between the reference beam and the probe beam is made as close as possible to a predetermined carrier, or difference, frequency. The unterminated beam portion 40a enters an optical delay line means 44, and is reflected between first and second mirrors 44a and 44b, to emerge, after some delay time, as a beam 44c which is reflected by an output mirror 44d. The reflected and delayed coherent light pulse traverses a second beam expanding means 46, utilizing at least first and second lenses 46a and 46b, and emerges as a reference beam 48 which illuminates the same portion of third beam splitter 35 as is illuminated by probe beam 34. When the frequency-shifted beam 48 is combined with beam 34, an interference pattern is formed in a focal plane. The interfering patterns generated by the amplitude-pulsed reference beam 48 and probe mean 34 are impingent upon the front surface 50a of the coherent light phase-detecting CTD array 50 of the present invention; array 50 is so positioned that front surface 50a is in the focal plane of the apparatus. Thus the amplitude modulation in beam 28 is shifted upward from baseband (at which many sources of 1/f noise may deteriously affect the detection process) to a carrier, or difference, frequency $\Delta f$ (e.g. 50–100 KHz.) determined by the difference in frequency of the signals driving the pair of Bragg cells. It is convenient to sample each cell a plurality $S=4$ times (corresponding to $+I$, $+Q$, $-I$ or $-Q$ data at 90° rotations of phase) during each carrier cycle, and to obtain the difference (a) between the first $(+I)$ quadrant and third $(-I)$ quadrant samples to provide an in-phase I-axis component signal, and (b) between the second $(+Q)$ quadrant and fourth $(-Q)$ quadrant samples to provide a quadrature-phase Q-axis component signal. Differences can be obtained by the well known correlated double sampling process. The computation of pixel amplitude (from $\sqrt{(I^2+Q^2)}$) and pixel phase (from $\tan^{-1}(Q/I)$) of the signal at each pixel, is well known. The relatively low signal bandwidth allows the sampling rate (which might be $f_c \times S = 50$ KHz $\times 4 = 200$ KHz.) to be reduced at the array and allow phase output samples to be delivered at only twice the information bandwidth (e.g. at $2 \times 5$ KHz $=10$ KHz). Since each output sample requires both an I component and Q component, a pixel readout rate of only 20 KHz is needed, rather than 200 KHz. This order-of-magnitude reduction allows a concomitant increase in imager array size.

Electronic means, themselves well known to the CTD imaging art, receive respective vertical (column) and horizontal (row) scan input signals from respective apparatus terminals 10C and 10R, at inputs 52a and 52b of the electronics means 52, for providing the required array scanning signals at electronics outputs 52c and 52d. Responsive to the scanning signals and the impingent light interference patterns, video information is provided to video input 52e of the electronics means. These video signals are processed to provide: a video output 52f, which may be further amplified by video amplifier means 54 to provide a video amplifier output at apparatus terminal 10V; and video phase information at output 52g, for coupling to apparatus phase output terminal 10P. Computational means, not shown, may utilize the output signals at terminals 10V and 10P, in conjunction with the known row and column scan signals at the terminals 10R and 10C, to compute any derivable apparatus output data.

Figure 2:
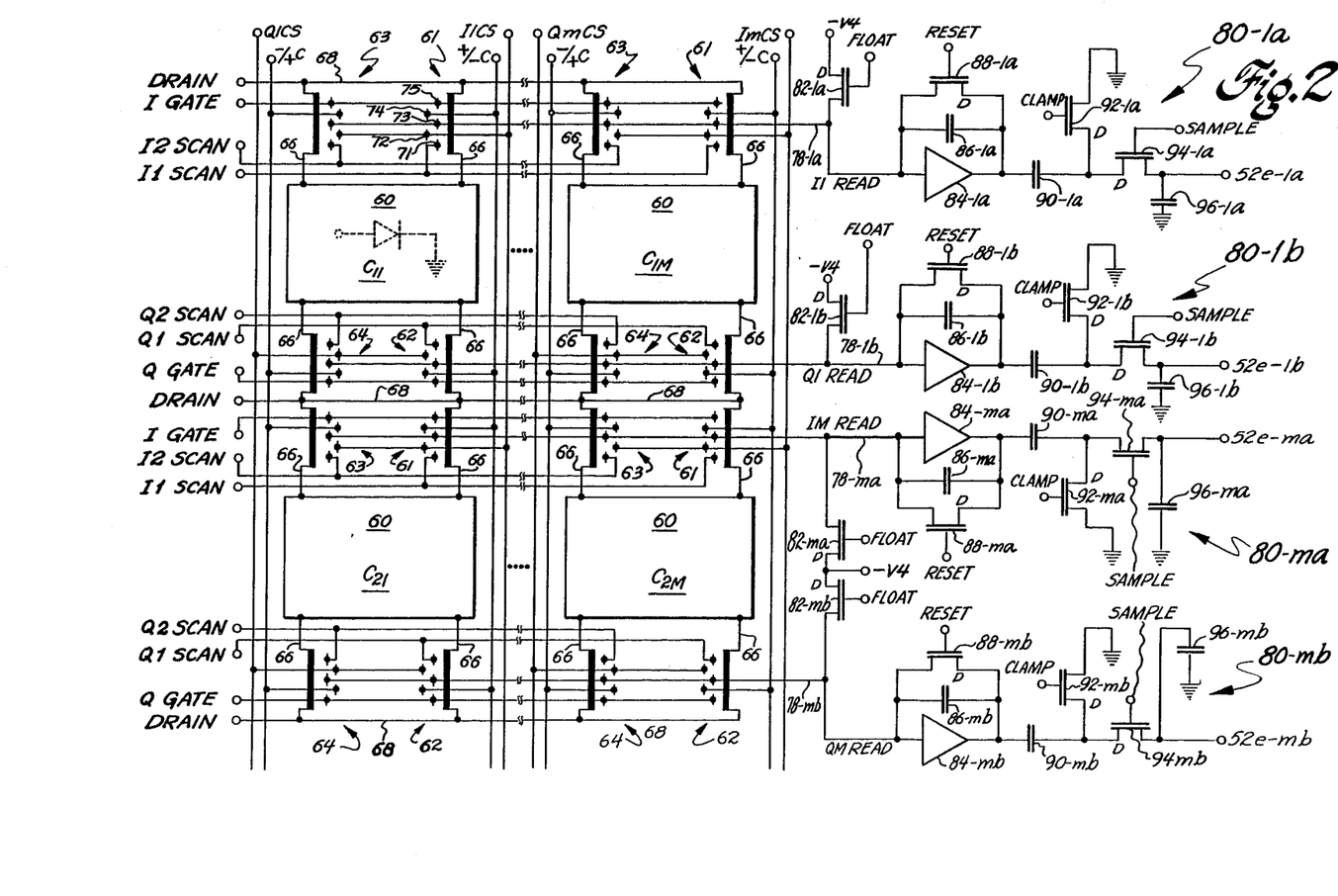
FIG. 2 is a schematic block diagram of a portion of the novel CTD array of the present invention.

Referring now to FIG. 2, the coherent light phase detecting focal plane CTD array 50 comprises a 2-dimensional array of CTD cells $C_{ij}$, where i is the row number (from 1 to L, with only the first and second rows being shown in FIG. 2), and j is the column number (from 1 to M, with only the first and the M-th column shown in the M-column array of FIG. 2). The array row and column axes may be substantially orthogonal, as shown; the array may, if desired, be a square array with L=M cells in each of the row and column dimensions, or may be rectangular (L≠M) or of such other shape as desired. As is well known to the CTD art, the array is fabricated upon a bulk substrate of a first conductivity-type semiconductor, e.g. a N-type bulk silicon (Si) semiconductor, serving as the common cathodes of all of the array cells. A layer of the opposite polarity-type semiconductor, e.g. a P-type Si layer for use with the N-type Si substrate, is fabricated on the top surface of the substrate and is separated into an array of pixel anode regions 60, each having a somewhat rectangular shape in the representation of FIG. 2. The P-type anode region 60 of each of the cells is isolated from the anode regions 60 of all other cells of the array. Thus, a diode is effectively formed under each anode region 60, with the diode being subsequently reverse-bias and forming a depleted charge-storage region in which photon-induced charge will be stored, in manner well known to the art.

In accordance with the present invention, a plurality S of field-effect transistors are fabricated adjacent to each cell anode region; in the illustrated embodiment, four field-effect transistors (FETs) 61–64 are fabricated with P-type channels and N-type gate regions. The channels of the FETs are shown schematically by the heavier channel lines; one possible physical placement is to have each of the four FETs in a different area separated from an associated different one of the four corners of the light-senstive cell anode layer. Thus, a pair of FETs 61 and 63 are placed to one side of the light-sensitive region of each cell and another pair of FETs 62 and 64 are placed to the opposite side of that cell region, in this particular embodiment. Each of the plurality of FETs 61–64 associated with any particular cell has a source electrode 66 which is connected to the anode region of that cell, so that each cell anode is effectively the source of the S=4 FETs associated with that cell; the drain electrode of each of the FETs 61–64 is connected to one of drain lines 68, at which a substantially constant DC drain potential (e.g. a drain voltage −Vd for P-channel FETs) is continuously provided during the light- detecting operation of the array. Each of the FET devices has a plurality, e.g. 5, of gate electrodes 71–75, insulatively formed above the elongated channel thereof, for controlling travel of charge packets from the associated cell anode region/FET source region to the device drain region (near lines 68), in accordance with scan, column select CS, clock CLK and gate signals provided (with the waveforms to be discussed hereinbelow with respect to FIG. 4) by off-array electronics and other peripheral electronics, to be described hereinbelow, and all of which electronics may be included upon the integrated circuit containing the array. The area of the back-biased photodiode (i.e. the area of each pixel anode) occupies most of the area of the cell; the four FETs are of relatively small area (preferably less than 10% of the total cell area, and most preferably as small as possible). By placing one of the four FETs at each corner of the rectangular light-collecting anode, the gate lines can be placed over the required isolation channels between adjacent cells. The gate lines may be best arranged in two levels, with silicon dioxide insulation therebetween; the lower level (closest to the n-Si anode layer) may have the FET gate electrodes and control signal lines in a first (e.g. vertical) direction (e.g. such as the +/−C, I1CS and/or Q1CS and −/+C signal lines between the columns of cells or the end column and the adjacent array vertical edge) and the upper level would then contain the FET gate electrodes and control signal lines in the other (e.g. horizontal) direction (e.g. such as the drain and Q2 SCAN, Q1 SCAN, Q GATE and/or I GATE, I2 SCAN, I1 SCAN signal lines between the rows of cells or the end row and the adjacent array horizontal edge).

Figure 3:
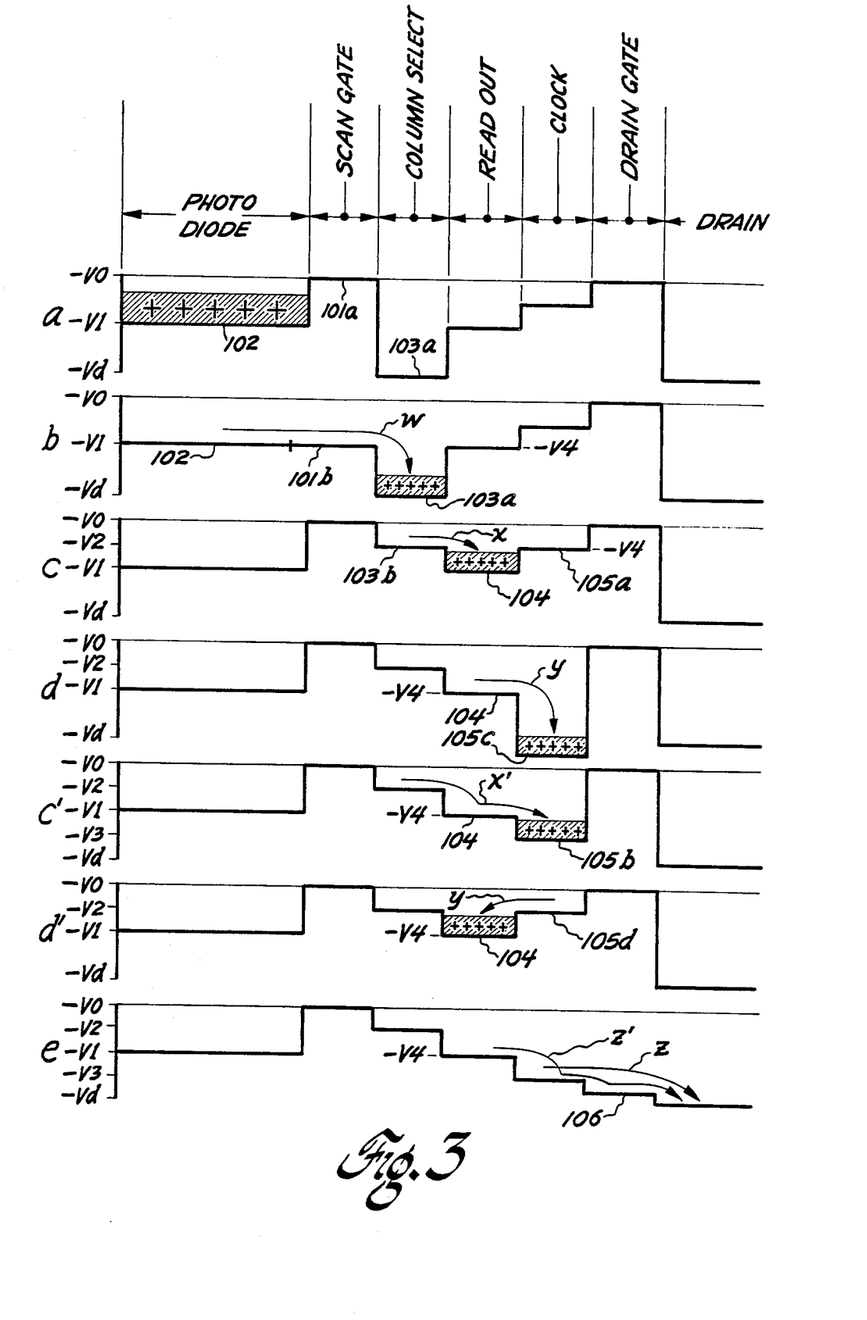
FIG. 3 is a set of surface potential diagrams useful in understanding charge transfer operations in one cell of the array.

The first gate 71, nearest the source of each FET, is a scan gate for controlling passage of photocharge, collected in the back-biased photodiode, into subsequent potential wells located further toward the drain region of that one of the four FETs. This first gate is normally "off" (e.g. at about zero volts), as seen in FIG. 3-view a, but is biased to a first potential (e.g. −V1, for a P channel FET, where −V1 is the nominal backbias voltage of the photodiode and can be about −5 volts in the illustrated example), when a photocharge flow is to be enabled away from the photodiode anode, and into a selected column potential well, as seen in view b of FIG. 3. The second gate electrode 72 of each FET is a column select electrode beneath which a charge reservoir is either (1) absent when this gate is at a second potential V2 only slightly more attractive to the photocharge than the scan gate potential but less attractive than a readout electrode at the V1 potential $|V2|<|V1|$, e.g. a slightly more positive potential −V2 in a P-type FET (as in view c of FIG. 3), or (2) present when this gate is at a third potential more attractive to the photocharge $|V3|>|V1|$ e.g., a more negative potential −V3 in a P type FET (with +q photocharge flow, as in view c' of FIG. 3). Photo-generated charge can be integrated, if desired, for a time interval of several carrier frequency cycles, by maintaining the column select electrodes in the more attractive, or "off", slate and with cyclic sequencing of the scan gate electrodes into the "on", or less attractive, condition, to cause all of the charge generated in like phase quadrants to be delivered to the same column-select charge storage region (beneath that same column-select electrode). Normally the photodiode charge is dumped four times during each carrier cycle, with the dumped charge being steered into the potential well beneath the CS electrode of the appropriate one of the four FETs.

For readout, it is convenient to read out all of the +I quadrant charge and all of the −I quadrant charge during that one-quarter-cycle time interval corresponding to the −Q quadrant, while it is convenient to read out all of the charge collected during the +Q and −Q quadrants during the time interval corresponding to the (next-cycle) +I quadrant. Therefore, there are no additions to either of the charge packets being read out, during the readout process. The third gate electrode 73 is a readout gate, to which is applied an intermediate, or float, potential at a fourth level, i.e. −V4, which has a magnitude about one-half of the CS electrode off value, i.e. $|V4| \sim |V3|/2$; the row/line readout signal will be extracted, along one of signal readout lines 78-ia or 78-ib from these gates. The fourth, or clock, gate has one of a pair of clock CLK signals applied thereto, with a potential either greater or lesser than the readout electrode potential. Typically, the CLK signal levels will, similar to the column select "on" level, be slightly below the common potential (∼0 volts) and a potential −V6, where $|V6|$ is a value of slightly less magnitude than the magnitude of the CS electrode "off" value. The fifth gate is an injection, or drain, gate, which is normally off (e.g. held at the common potential) and is enabled, after charge readout, to a potential $-V8$, where $|V6|<|V8|<|Vd|$, to inject the charge packets into the FET drain and clear the FET for the next charge-readout cycle.

The particular illustrated embodiment of FIG. 2 is a line-scanned array, wherein all of the j-th cells (for j=1 to L) of each column i (sequentially from i=1 to i-M) are simultaneously "scanned", or enabled. The entire j-th column of cells and the FETs associated therewith are simultaneously operated upon, so that the charge in cells $C_{1j}$ to $C_{Lj}$ are simultaneously read into storage regions of one of the FETs 61-64 associated with each cell, prior to the charge being read from sequential ones of the FETs. The charge in each of cells $C_{RI}$ to $C_{RM}$, along each row R (R=1 to L), is sequentially read out of the cells along that row/line, to provide a line of data for one of the four amplitude/phase quadrants. Thus, during any one portion of each line scan, only one of the four quadrant-selecting FETs 61-64 is enabled for the cells of the entire array. By completing a set of four scans, each associated with one of the four quadrants, in each cycle of the carrier signal, the relative contributions, at each cell, along the I axis (first and third scan, for the $+I$ or $-I$ directions, respectively) and the Q axis (second and fourth scan, for the $+Q$ and $-Q$ directions respectively) can be obtained, stored and/or processed to find, by well known relationships, the amplitude and/or phase of light incident on each cell of the array.

To facilitate proper operation, each pixel row has associated therewith a pair of on-chip preliminary signal processing means 80; a first means 80-ia is utilized for processing the I-axis readout video signal, while the other means 80-ib is utilized for processing the Q-axis readout video signal from the same line. The I-axis readout component $I_n$ of the n-th line thus appears at an output 52e-na, while the Qn readout line output appears at an output 52e-nb. Each means 80 comprises a first semicondcutor switching device 82 (e.g. devices 82-1a, 82-1b, ... 82-ma or 82-mb in the respective I1, Q1, ... , Im or Qm channel) for connecting and disconnecting the intermediate float potential ($-V4$) responsive to the state of the FLOAT signal. The input of a charge amplifier means 84 (e.g. amplifier 84-1a, 84-1b, ..., 84-ma or 84-mb is connected to the readout line, as is one terminal of an integration capacitor 86 and the controlled-conduction circuit of a rest device 88. The other terminals of both the reset device controlled-conduction circuit and the integration capacitor 86 are connected to the output of the amplifier 84. This amplifier is connected through a DC-removal capacitor 90 to the drain of a clamp switching device 92, having its source electrode connected to circuit common potential and its control electrode receiving the CLAMP signal. Similarly, a sampling device 94 has a drain electrode connected to the associated channel clamping device drain electrode, with the sampling device source electrode connected to the non-common- potential terminal of a holding capacitor 86 and to the channel output terminal 52e-na/b. The control gate electrode of the sampling device 84 receives the channel SAMPLE signal.

The effect, and criteria for choice, of the various gate electrode potentials will be better understood by reference to the diagrams of FIG. 3, wherein the surface potential beneath each of the gate electrodes is illustrated for each of the various portions of an operational cycle. View a depicts the surface potentials in one cell, of the array, when the cell is not then being addressed, i.e. the scan electrodes are, in portion 101a, at a sufficiently low potential (e.g. about VO volts) as to be much less than the potential (e.g. $-V1$ volts in portion 102) on the photodiode, so that the scan gate is said to be in a blocking state and change generated in the photodiode cannot pass to the column-select CS electrode, even though the CS electrode is, as shown by portion 103a, at a magnitude of potential (e.g. $|Vd\uparrow>|V1|$) greater than the photodiode potential and would normally be sufficiently attractive so that any change in the FET structure would be held beneath this electrode. Thus, the (+) charges held in the photodiode will not participate in the readout operation, unless these charges are moved out of the photodiode area.

Photodiode charge flows into the column select region 103a as shown by arrow W in view b of FIG. 3, whenever the scan gate potential is increased, as in portion 101b, to a magnitude at least the photodiode potential, here $|V1|$ in portion 102, but less than the magnitude, here $|Vd|$, of the CS region 103a. The height of the scan gate barrier is thus effectively lowered. The photodiode potential is also now reset to the scan gate region surface potential, at which level the photodiode will then float when the scan gate is opened, when the scan gate potential barrier is again raised at the start of one of views c or c'.

Readout operation, accomplished one cell at a time, commences with the raising of the column select CS potential for each pixel row to a potential providing a more "pressure" for the charge in the column select region to flow into the region under the readout electrode. If the $+/-$ clock signal is drawing the adjacent clock electrode to a magnitude $|V4|$ of surface potential less than the potential of the readout electrode (as in portion 104 of view c), then the charge flows (as in portion 105a), as shown by arrow X, into the readout region 104, when the CS region potential decreases, as in portion 103b. If, conversely, the adjacent region is driven by the $-/+$ clock signal to a potential (as in portion 105b of view c') greater than that of the readout electrode (portion 104), then the charge not only flows into the readout region of portion 104, but, as the clock region is more attractive to the charges than the readout region, continues to flow, as shown by arrow X', into the deeper $-/+$ clock region well. The charges remain under either the readout electrode ($+/-$clock) or the clock electrode ($-/+$clock), until the clock electrode signal changes. The readout electrode potential is first reset and floated, and its potential is stored in capacitors 90. It will be seen, by reference to FIG. 2, that charge packets to be assigned a positive weight during the readout process (i.e. in quadrants $I_1$ or $Q_1$) are held under the readout electrode (and therefore proceed from view b sequentially through views c and d, into view e) while the charge packets to be assigned a negative readout weight the (i.e. in quadrants $I_2$ or $Q_2$) are held under the clock electrode (and therefore proceed from view b through views c' and d', into view e).

After readout electrode reset, floatation and potential storage, the state of the clock signal reverses and the charge packets reverse locations; the packets previously stored under the readout electrode flow, as shown by arrow Y, in the clock potential well (i.e. from portion 104 to portion 105c) in view d; while the packets previously stored under the clock electrode (portion 105b of view c') now flow in the direction of arrow Y', into the readout well (i.e. from portion 105d to portion 104), as shown in view d'. The net potential charge is proportional to the difference in the $I_1$ and $I_2$ packet magnitudes, or in the $Q_1$ and $Q_2$ packet magnitudes, dependent upon the portion of the cycle. This potential difference for each cell is increased by an associated one of amplifier means 84 and delivered, upon closure of the associated one of sampling switch means 94, to an associated output storage capacitance 96, from which storage means the voltage is then reviewed and processed in known manner.

The operational cycle for that cell is terminated by the application of a large drain gate potential, as in region 106 of view e, so that the charge will flow into the drain electrode from the last charge-holding region, i.e. from the readout region through the clock and drain gate regions (per arrow Z'), or from the clock region through the drain gate region (per arrow Z) to the drain of the FET structure. To facilitate this flow, both the ±clock and the −/+clock are set to potentials more attractive than the readout electrode, but less attractive than the drain gate or the drain potentials.

Figure 4:
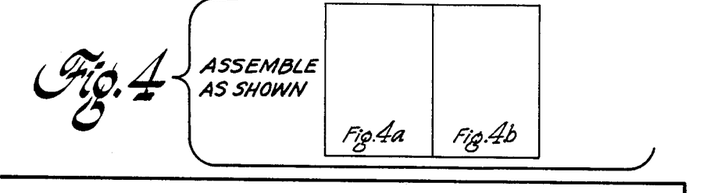
FIGS. 4A and 4B are a set of time-related waveforms utilized in the novel array of the present invention, and useful in understanding principles of operation thereof.
Figure 4A:
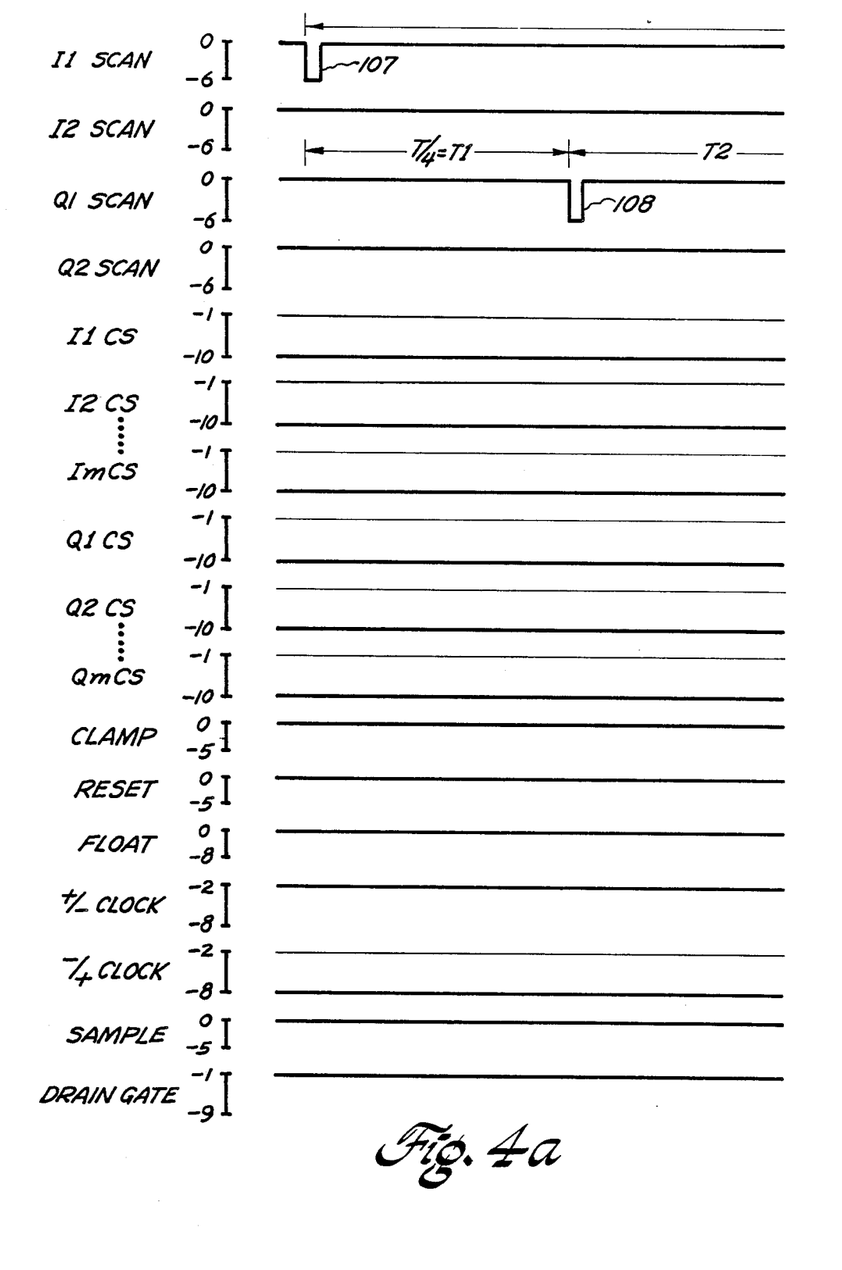
Figure 4B:
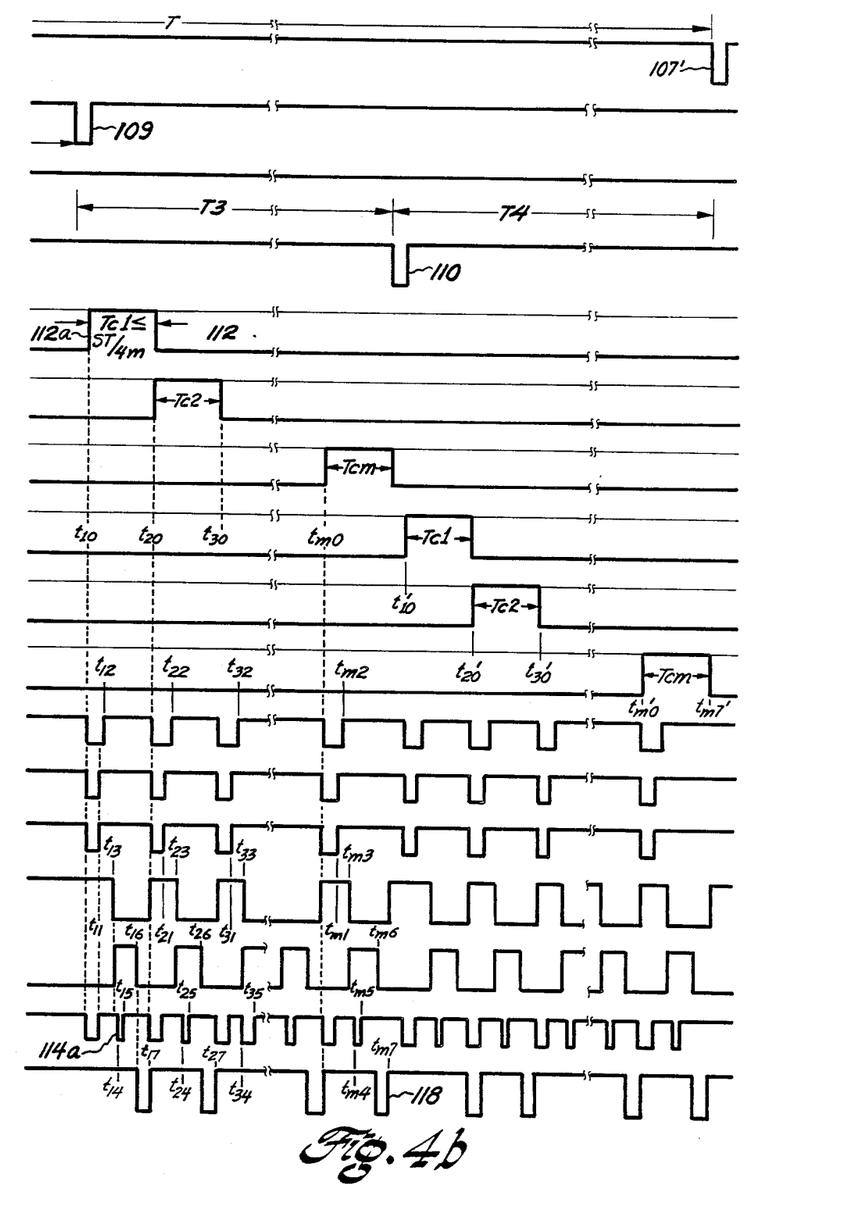

Referring now to FIG. 2 and especially to the signal waveforms of FIG. 4 (comprised of the abutted FIGS. 4a and 4b), the CTD imager array operates as follows: at the beginning of a carrier waveform cycle, i.e. at the beginning of a cycle time interval T, the +I axis component is to be read simultaneously from all cells in the array; an I1 scan pulse 107 occurs, equivalent to the change from portion 101a to portion 101b in view a of FIG. 3, and the +I charge moves into the column select CS potential well in all +I devices 61. After a quarter-cycle has elapsed, i.e. after a time interval T1 has past, the +Q charge is moved into the CS potential well in all +Q devices 62 responsive to a Q1SCAN pulse 108. After another quarter-cycle elapses, i.e. after time interval T2 has past, the −I charge is moved into the CS potential well of FET 63, responsive to an I2SCAN pulse 109. The I differential readout can now begin and be completed before the −Q charge is moved into the CS potential well of FET 64, responsive to a Q2SCAN pulse 110 (while signifies that the Q differential readout can begin).

The I or Q charge readout is accomplished on a column-by-column basis. All of the I charge in a first column (j=1) is first read out, in a first-column readout time interval Tc1, which is of slightly less duration than an interval (T/4)(1/m), due to the duration of pulse 109. Sequentially thereafter, all of the +I axis components for each sequential one of the remaining columns of cells will be read in the remainder of one-quarter of a carrier waveform cycle time interval T3=T/4. Thus, at the first column readout commencement time $t_{10}$, the first column I column-select electrodes 72 receive the I1CS waveform, which rises from the resting (−10 volt) level to the enabling (−1 volt) level at edge 112a, to move the positive charge packet into the potential well under the readout electrode. At the start of each column reading time interval, the CLAMP, RESET, FLOAT and SAMPLE waveforms all fall to their active levels, which discharges the integration capacitors 86 and sample capacitors 96. The float devices 82, reset devices 88 and sample devices 44 are all turned off at time $t_{11}$, with the clamp devices 92 being turned off at a slightly later time $t_{12}$. Thereafter, both the +/−clock and the −/+clock signals change state at time $t_{13}$; the ±clock signal stays at the "off" (−2 volt) level until time $t_{16}$, while the +/−clock signal stays at the "on" (−8 volt) level until the first column read operations end at time $t_{17}$. In the interim, the charges in both of the I devices 61 and 63 move into, or out of, the readout potential well (dependent upon whether the filling of the respective potential well occurred during the +I or −I quarter-cycle) and the differential charge is read out, integrated in the associated one of amplifier means 84 and provides a voltage which is sampled by the sample pulse 114a which occurs between time $t_{14}$ and time $t_{15}$. At a slightly later time $t_{16}$, the drain gate is enabled, and both the +/−clock and −/+clock regions are set to the "on" state (−8 volts) to drain all of the charge out of both I quadrant FETs 61 and 63; the drain gate is disabled at the end of the column-readout time interval, i.e. at time $t_{17}$.

The stored channel video value is read, at that one of the output channel I terminals 52e-1a through 52e-ma for that row, in the time interval from the end of the sample pulse 114a, at time $t_{15}$, until the column-read interval ends at time $t_{17}$. The video value can be digitized and stored on a channel-by-channel (i.e. row-by-row) basis. All first column waveforms return to their resting levels immediately prior to the time $t_{20}$ at which the second column of the array is read out for I axis charge values.

Each of the second, third, . . ., m-th columns of the array is now sequentially readout for I values, in the associated one of the subsequent column readout time intervals, Tc2, . . ., Tcm, each of duration Tc≦T/(4m). Thus, readout of the second column of cells commences at time $t_{20}$, with the enabling of the respective FLOAT, RESET, CLAMP and SAMPLE signal initial edges. This process continues with the same set of events as in the first column interval, between times $t_{10}$ and $t_{17}$, with changes only in that one of the other (M−1) column-select CS signals (I2CS-ImCS) is used. Thus, the M-th (last) column is read out, starting at time $t_{mo}$, when the m-th consecutive I axis column-select signal ImCS commences, in conjunction with the falling edges of the FLOAT, RESET, CLAMP and SAMPLE signals. At subsequent time $t_{m1}$, the RESET, FLOAT and SAMPLE signals turn "off" and the CLAMP signal turns off slightly thereafter, at time $t_{m2}$. At subsequent time $t_{m3}$, the clocks invert, forcing the I charge to move with respect to the readout electrode 73. The last column I sample occurs from time $t_{m4}$ to time $t_{m5}$. Thereafter, at time $t_{m7}$, the last of the I column output portions is terminated by charge injection responsive to a drain gate pulse 118. It will be seen that the scan gate signals (I1SCAN or I2SCAN, as well as the Q1SCAN and Q2SCAN signals to be discussed hereinbelow), the column select signals, the +/−clock and the −/+clock signals, as well as the FLOAT, RESET, CLAMP, SAMPLE and drain gate signals, can all be generated by well known means, such as synchronized shift registers of the desired length, in which at least one binary data pattern cyclically circulates.

Charge continues to collect in all cells not then being readout. The second, or Q-axis charge, quarter-cycle readout commences at time $t_{10'}$ of time interval T4, after the single Q2SCAN signal pulse 110, which causes all columns to transfer charge in the −Q device 64 thereof; the +Q charge was previously transferred responsive to the Q1SCAN pulse 108, acting on devices 62. All of the column select signals are now QnCS signals, where n=1 to m. The method and signal sequence is exactly the same as for I-axis readout. Each of the first, second,. . ., m-th columns of the array are now readout for the Q axis values, in the associated one of the subsequent column readout time intervals, each of duration Tc.

Again, each column's video samples are digitized and stored prior to the sampling of the next column's video signal. The separate amplifier/sampler means 80-nb, for the n-th row, is used for the Q axis signals, instead of the I axis means 80-na, as this provides certain clarifying features in the monolithic circuit layout. It will be seen that the serial nature of the video sequence appearances may allow a single means 80-n to be used for each row. Since the total I difference value an the total Q difference value are available in storage, these values can be retrieved and used to calculate cell amplitude ($=\sqrt{(I^2+Q^2)}$) and cell phase ($=\arctan(Q/I)$) information. Thereafter, the entire four-quadrant process begins again, with the first I1SCAN pulse 107' at time $t_{10}$ of the next cycle T.

While the present invention has been discussed with respect to that one preferred embodiment disclosed herein, many modifications and variations will now become apparent to those skilled in the art. It is my intent, therefore, to be limited only by the scope of the appended claims.

What I claim is:

1. Apparatus for detecting at least the phase of a carrier light beam incident upon a focal plane, comprising:

a bulk substrate of a first conductivity-type semiconductor, having a first surface;

a layer of the opposite conductivity-type of that semiconductor, fabricated upon said first surface and formed into an array, at said focal plane, of a plurality of charge-transfer-device (CTD) cells, each for storage of electrical charge converted from optical photons of said incident beam impingent upon said layer;

a plurality of means, associated with each CTD cell, for separately and individually collecting the charge in that cell during each associated different one of a like plurality of substantially equal duration sampling time intervals in an operational cycle, to each provide an associated one of a like plurality of signals of characteristic responsive to at least the phase of said incident beam; and means for processing the plurality of signals from each CTD cell to derive beam phase information therefrom.

2. The apparatus of claim 1, wherein each of said charge collecting means is a semiconductor device formed in the semiconductor layer of the array.

3. The apparatus of claim 2, wherein each semiconductor device is a field-effect transistor (FET).

4. The apparatus of claim 3, wherein four separate FETs are provided for each CTD cell, with respective first and third FETs for each cell being assigned for determination of respective positive and negative values of a first, in-phase I portion of the incident beam at that cell and respective second and fourth FETs for each cell being assigned for determination of respective positive and negative values of a second Q portion, in phase-quadrature with the first I portion, of the portion of the beam incident upon that cell.

5. The apparatus of claim 4, wherein each cell has an anode; each FET comprising a source electrode connected to the anode of the associated CTD cell, a drain electrode receiving a substantially constant potential, and a plurality of gate electrodes interposed between said source and drain electrodes; one of said gate electrodes being a readout gate electrode used for generating a readout signal having a magnitude responsive to the magnitude of charge transferred from said cell during the associated sampling time interval; at least one other gate electrode being interposed between said source and readout gate electrodes and used to selectively manipulate cell charge to said readout electrode during the proper portion of the sampling time interval; and a clock gate electrode interposed between said readout gate and drain electrodes for controlling the temporal occurrence of the readout signal.

6. The apparatus of claim 5, wherein the array of cells is arranged as a matrix with a plurality of rows, each having the same number of columns; and wherein the at least one other gate electrode of each of the FETs comprises: a first scan gate electrode for selectively enabling the movement of collected charge from the associated CTD cell into a potential well in the FET; and a second column-select gate electrode for selecting that mutually-exclusive one of the columns of the array from which charge is to be moved.

7. The apparatus of claim 6, wherein each FET further includes a fifth gate electrode, closest to the drain electrode, for controlling the flow of charge into said drain electrode at the end of each cycle portion in which that FET is used.

8. The apparatus of claim 6, wherein said processing means includes first and second preliminary signal processing means for each row of the array; the readout signals from the first and third FETs of all cells along the particular row being provided in parallel as the input singal to the first preliminary means, and the readout signals from the second and fourth FETs of all cells along the particular row being provided in parallel as the input signal to the second preliminary means.

9. The apparatus of claim 8, wherein all cells of the array and all preliminary signal processing means are integrated into a single monolithic semiconductor integrated circuit.

10. The apparatus of claim 8, wherein each preliminary means comprises: amplifier means for providing a signal voltage proportional to the readout signal; means for resetting the signal voltage substantially to a selected value prior to charge readout from any column; means for clamping the signal voltage with respect to a common potential; and means for sampling the signal voltage, after completion of a select portion of the signal at the clock gate electrode, and for holding that sampled voltage until a next sample occurs.

11. The apparatus of claim 10, wherein the resetting means of all preliminary means operate substantially simultaneously; and the sampling and holding means of all preliminary means operate substantially simultaneously.

12. The apparatus of claim 10, wherein each preliminary means further comprises means for temporarily floating the input signal at a predetermined and substantially constant float value.

13. The apparatus of claim 5, wherein the clock gate electrodes of each of the first and third FETs receives a first clock signal having at least a portion thereof controlling the polarity of the readout signal to a first polarity if charge is then present, and each of the clock gate electrodes of the second and fourth FETs receives a second clock signal also having at least a portion thereof controlling the polarity of the readout signal to the polarity opposite said first polarity if charge is then present.

14. The apparatus of claim 13, wherein the array of cells is arranged as a matrix with a plurality of rows, each having the same number of columns; and wherein the at least one other gate electrode of each of the FETs comprises: a first scan gate electrode for selectively enabling the movement of collected charge from the associated CTD cell into a potential well in the FET; and second columnselect gate electrode for selecting that mutually-exclusive one of the columns of the array from which charge is to then be readout.

15. The apparatus of claim 14, wherein each FET further includes a fifth gate electrode, closest to the drain electrode, for controlling the flow of charge into said drain electrode at the end of each cycle portion in which that FET is used.

16. The apparatus of claim 4, wherein each cell has an anode formed of a substantially rectangular portion of said layer; and each of the four FETs associated with a particular cell is positioned adjacent to, but insulated from, a different one of the corners of the anode layer portion of that cell.

17. The apparatus of claim 1, wherein the semiconductor material is silicon and the layer is of P-type silicon.

* * * * *